(12) United States Patent
Mathew et al.

(10) Patent No.: US 7,749,884 B2
(45) Date of Patent: Jul. 6, 2010

(54) METHOD OF FORMING AN ELECTRONIC DEVICE USING A SEPARATION-ENHANCING SPECIES

(75) Inventors: Leo Mathew, Austin, TX (US); Dharmesh Jawarani, Round Rock, TX (US)

(73) Assignee: AstroWatt, Inc., Round Rock, TX (US)

( * ) Notice: Subject to any disclaimer, the term of this patent is extended or adjusted under 35 U.S.C. 154(b) by 0 days.

(21) Appl. No.: 12/435,942

(22) Filed: May 5, 2009

(65) Prior Publication Data

US 2009/0280635 A1    Nov. 12, 2009

Related U.S. Application Data

(60) Provisional application No. 61/050,696, filed on May 6, 2008.

(51) Int. Cl.
     *H01L 21/28* (2006.01)
(52) U.S. Cl. ............... 438/602; 438/458; 257/E21.294
(58) Field of Classification Search ........... 438/458, 438/602; 257/E21.294
See application file for complete search history.

(56) References Cited

U.S. PATENT DOCUMENTS

| | | | |
|---|---|---|---|
| 5,527,766 A | 6/1996 | Eddy | |
| 5,854,123 A | 12/1998 | Sato et al. | |
| 6,794,276 B2* | 9/2004 | Letertre et al. | 438/506 |
| 6,809,009 B2 | 10/2004 | Aspar et al. | |
| 6,881,644 B2 | 4/2005 | Malik et al. | |
| 7,180,093 B2* | 2/2007 | Takayama et al. | 257/59 |
| 7,183,179 B2* | 2/2007 | Droes et al. | 438/473 |
| 7,273,788 B2 | 9/2007 | Forbes | |
| 7,348,076 B2 | 3/2008 | Locher et al. | |
| 2004/0235268 A1* | 11/2004 | Letertre et al. | 438/459 |
| 2005/0061230 A1 | 3/2005 | Kokta et al. | |
| 2006/0076559 A1* | 4/2006 | Faure et al. | 257/49 |

(Continued)

FOREIGN PATENT DOCUMENTS

| | | |
|---|---|---|
| JP | 2006-332681 A | 12/2006 |
| WO | 2005/117123 A1 | 12/2005 |
| WO | 2005117123 A1 | 12/2005 |

OTHER PUBLICATIONS

Tong, Q. Y. et al. "A 'smarter-cut' approach to low temperature silicon layer transfer"; Appl. Phys. Lett. 72 (1), Jan. 5, 1998, American Institute of Physics, 1998, pp. 49-51.

(Continued)

*Primary Examiner*—Charles D Garber
*Assistant Examiner*—Stanetta D Isaac

(57) ABSTRACT

A method of forming an electronic device can include forming a metallic layer by an electrochemical process over a side of a substrate that includes a semiconductor material. The method can also include introducing a separation-enhancing species into the substrate at a distance from the side, and separating a semiconductor layer and the metallic layer from the substrate, wherein the semiconductor layer is a portion of the substrate. In a particular embodiment, the separation-enhancing species can be incorporated into a metallic layer and moved into the substrate, and in particular embodiment, the separation-enhancing species can be implanted into the substrate. In still another embodiment, both the techniques can be used. In a further embodiment, a dual-sided process can be performed.

20 Claims, 4 Drawing Sheets

U.S. PATENT DOCUMENTS

2006/0240275 A1    10/2006    Gadkaree
2007/0071900 A1*    3/2007    Soussan et al. .......... 427/372.2
2007/0249140 A1    10/2007    Dross et al.
2007/0269960 A1*    11/2007    Letertre et al. .............. 438/458
2008/0063840 A1    3/2008    Morita et al.

OTHER PUBLICATIONS

Wolf, Stanley "2.10 Silicon-on-Insulator (SOI) Isolation Technologies", Silicon Processing for the VLSI Era, vol. 2: Process Integration, Lattice Press, California, 1990, 66-78 pages.

Llona, L. D. Vargas et al. "Seedless Electroplating on Patterned Silicon", J. Micromech, Microeng. 16, Journal of Micromechanics and Microengineering, IOP Publishing Ltd , May 8, 2006, pp. S1-S6.
U.S. Appl. No. 12/435,947, filed May 5, 2009.
U.S. Appl. No. 12/467,035, filed May 15, 2009.
AA040801-WO International Search Report and Written Opinion mailed Dec. 18, 2009, 10 pages.
International Search Report and Written Opinion dated Dec. 18, 2009 for PCT/US2009/043019.
International Search Report and Written Opinion dated Dec. 30, 2009 for PCT/US2009/044203.

* cited by examiner

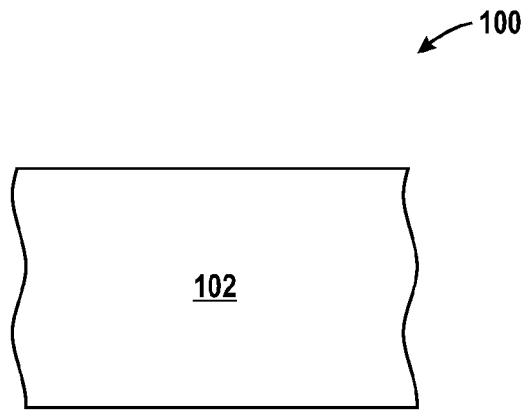
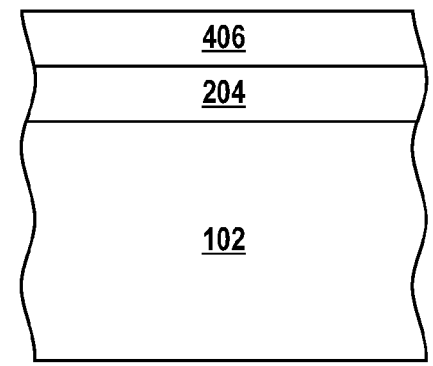
FIG. 1
FIG. 2
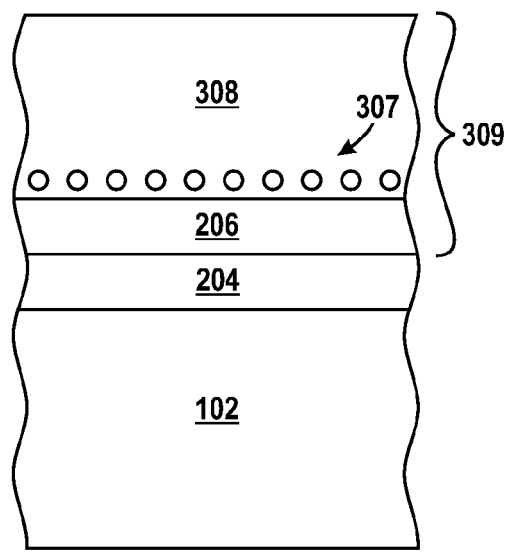
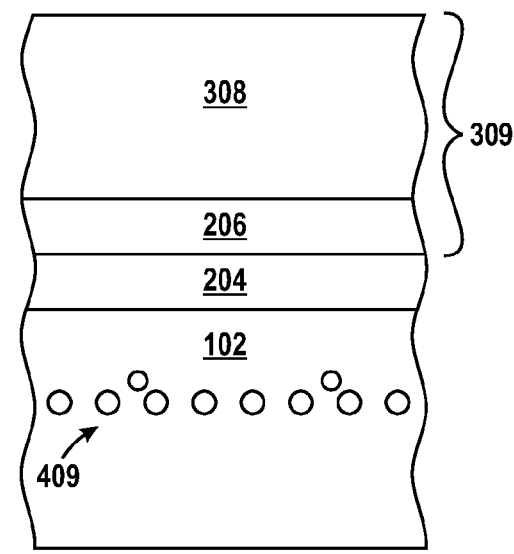
FIG. 3
FIG. 4

METHOD OF FORMING AN ELECTRONIC DEVICE USING A SEPARATION-ENHANCING SPECIES

RELATED APPLICATION

This is related to and claims priority under 35 U.S.C. §119(e) to U.S. Patent Application No. 61/050,696 entitled "Method of Forming Devices on a Semiconductor Layer and Related Devices" by Mathew et al. on May 6, 2008, which is assigned to the current assignee hereof and incorporated herein by reference in its entirety.

FIELD OF THE DISCLOSURE

The present invention relates generally to electronic devices, and in particular to methods for making electronic devices on a layer that has been separated from a substrate.

RELATED ART

The use of semiconductor layers that have been transferred onto substrates or substrates that have been thickened using various growth processes have been used in technologies such as silicon-on-insulator (SOI) technology. The transfer of layers therein involves process incorporation of a cleaving plane, sticking to a foreign substrate and separation of the surface layer. The incorporation of a cleaving plane is performed using a process of ion implantation or formation of porous layers. The bonding to a foreign substrate involves Van der Waals forces on extremely smooth surfaces; eutectic bonding using suitable materials; or thermo-compression bonding using suitable materials, elevated temperature, and elevated pressure. The separation involves annealing of the bubbles and cracks formed during ion implantation. In the formation of devices, the cycle time and cost of processes such as ion implantation and the formation of smooth surfaces is expensive.

BRIEF DESCRIPTION OF THE DRAWINGS

Embodiments are illustrated by way of example and are not limited in the accompanying figures.

FIG. 1 includes an illustration of a cross-sectional view of a portion of a workpiece comprising a substrate.

FIG. 2 includes an illustration of a cross-sectional view of the workpiece of FIG. 1 after formation of a metal-containing film.

FIG. 3 includes an illustration of a cross-sectional view of the workpiece of FIG. 2 after formation of a conductive film.

FIG. 4 includes an illustration of a cross-sectional view of the workpiece of FIG. 3 after an annealing process.

Figure 5:
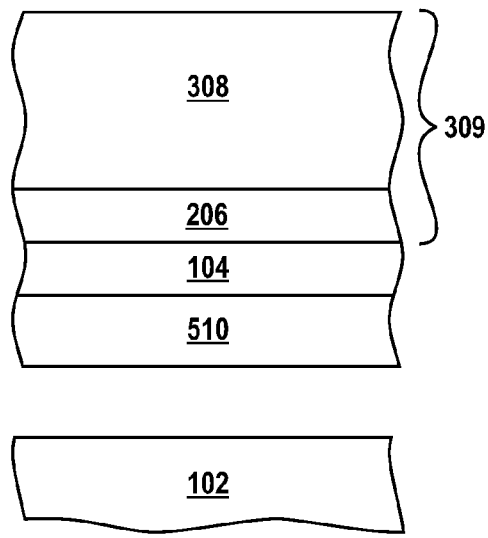
FIG. 5 includes an illustration of a cross-sectional view of the workpiece of FIG. 4 after a separation process.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Before addressing details of embodiments described below, some terms are defined or clarified. Group numbers corresponding to columns within the Periodic Table of the elements use the "New Notation" convention as seen in the *CRC Handbook of Chemistry and Physics*, $81^{st}$ Edition (2000-2001).

The term "metal" and any of its variants are intended to refer to a material that includes an element that is (1) within any of Groups 1 to 12, or (2) within Groups 13 to 15, an element that is along and below a line defined by atomic numbers 13 (Al), 50 (Sn), and 83 (Bi), or any combination thereof. Metal does not include silicon or germanium. Note, however, that a metal silicide is a metallic material.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

In addition, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A method of forming an electronic device can include forming a metallic layer by an electrochemical process over a side of a substrate that includes a semiconductor material. The method can further include introducing a separation-enhancing species into the substrate at a distance from the side. The method can still further include separating a semiconductor layer and the metallic layer from the substrate, wherein the semiconductor layer is a portion of the substrate. In an embodiment, the separation-enhancing species can be incorporated in the metallic layer during its formation and moved into the substrate during an anneal. In another embodiment, the separation-enhancing species can be implanted into the substrate. During heating or cooling of the workpiece using either or both embodiments, stress can develop near the separation-enhancing species and cause the semiconductor layer to separate from the substrate or make separation of the semiconductor layer from the substrate easier. Further, the separation can be made more reproducibly as compared to a mechanical tearing operation that does not use a separation-enhancing species. Although the description below provides many details, including particular numerical values and configurations, after reading this specification, skilled artisans will appreciate that the embodiments described herein merely illustrate and do not limit the scope of the present invention.

FIG. 1 illustrates a workpiece 100 comprising a substrate 102. The substrate may be a semiconductor substrate comprising a Group 14 element (silicon, germanium, or carbon), any combination of Group 14 elements (silicon germanium, carbon-doped silicon, or the like), or Group 13-Group 15 semiconductors (gallium arsenide, gallium nitride, indium phosphide, gallium indium arsenide, or the like). The substrate 102 can include a substantially monocrystalline, amorphous, or polycrystalline semiconductor substrate. In other embodiments, various combinations of materials may form the substrate. In a particular embodiment, the substrate can have a thickness of at least approximately 50 microns or at least approximately 200 microns. Although there is no theoretical upper limit on the thickness, the substrate may be no greater than approximately 5 meters or no greater than approximately 0.1 meter. As will be described in an alternative embodiment, ingot processing can be used to form substantially rectangular sheets.

FIG. 2 illustrates the workpiece 100 after formation of a doped region 204 and a metal-containing film 206 over the substrate 102. The doped region 204 includes a dopant of the opposite conductivity type as compared to the substrate 102, so that a pn junction is formed. The doped region 204 can include an n-type or a p-type dopant. The doped region 204 can be formed by gas-phase furnace doping, a spin-on dopant, depositing or growing a doped layer (a doped glass, a doped semiconductor layer (amorphous, polycrystalline, substantially monocrystalline), or by implantation. An anneal or dopant drive may be performed if needed or desired. In an embodiment, the peak concentration of the doped region 204 is at least approximately $10^{17}$, $10^{18}$, or $10^{19}$ atoms/cm$^3$. In an embodiment, the junction depth of the doped region 204 is at least approximately 0.01 microns or at least approximately 0.1 microns, and in another embodiment, the junction depth of the doped region 204 is no greater than approximately 5 microns or no greater than approximately 1 micron. In other embodiments, the doped region 204 can have other dopant concentrations or junction depths than previously described. If the dopant source for the doped region 204 includes a layer formed over the substrate 102, the layer may or may not be removed after the doped region 204 is formed. For example, a doped silicon layer may be formed over the substrate 102 and remain. In this particular embodiment, the doped region 204 may principally lie within the doped silicon layer. In another embodiment, the doped region 204 may not be used.

A conductive layer is formed over the substrate 102 and, if present, the doped region 204. The conductive layer can include a metallic layer and have one or more films therein. For example, the metallic layer can include a metal-containing film 206. The metal-containing film 206 can include an adhesion film, a barrier film, a seed film, another suitable film, or any combination thereof. The adhesion film can include a refractory metal (titanium, tantalum, tungsten, or the like), and the barrier film can include a metal nitride (TiN, TaN, WN of the like) or a metal semiconductor nitride (TaSiN, WSiN, or the like). The seed film can include a transition metal or transition metal alloy, and in a particular embodiment, the seed film can include titanium, nickel, palladium, tungsten, copper, silver, or gold. In other embodiments, other materials may be used within the adhesion film, barrier film, seed film, or any combination thereof. The metal-containing film 206 can be formed by physical vapor deposition (PVD, such as evaporation or sputtering), chemical vapor deposition (CVD), atomic layer deposition (ALD), electrochemistry, another suitable method, or any combination thereof. In another embodiment, the metal-containing film 206 may be bonded to the doped region 204 by forming a metal film over the workpiece 100 and reacting the metal film to form a metal silicide. In an embodiment, the metal-containing film 206 can have a thickness of at least approximately 1 nm or at least approximately 10 nm, and in another embodiment, the metal-containing film 206 can have a thickness no greater than approximately 10 microns or no greater than approximately 0.1 microns.

A conductive film 308 is formed over workpiece 100 as illustrated in FIG. 3. The metallic layer 309 includes the metal-containing film 306 and the conductive film 308. In a particular embodiment, the metallic layer 309 or over the conductive film 308, by itself, may have a thickness, such that it provides sufficient mechanical support to a subsequently formed semiconductor layer, wherein the semiconductor layer is formed from a portion of the substrate 102. The conductive film 308 may be substantially thicker and have a relatively higher conductance as compared to the metal-containing film 206. In a particular embodiment, the conductive film 308 is at least approximately 11 times, approximately 50 times, or approximately 500 times thicker than the metal-containing film 206.

The conductive film 308 can include any of the metals or metal alloys previously described with respect to the metal-containing film 206. In a particular embodiment, the conductive film 308 comprises tin, nickel, chromium, copper, silver, gold, or a combination thereof. Similar to the metal-containing film 206, the conductive film 308 can include a single film or a plurality of films. In a particular embodiment, the conductive film 308 can consist essentially of gold, and in another embodiment, the conductive film 308 can be mostly copper with a relatively thin indium-tin alloy to help improve soldering during a subsequent bonding operation. Other combinations of materials can be used such that the composition of the conductive film 308 is tailored to a particular application. The conductive film 308 can be formed by PVD, CVD, ALD, electrochemistry, another suitable method, or any combination thereof. The conductive film 308 and the metal-containing film 206 can include the same composition or different compositions and be formed using the same technique or different techniques. In an embodiment, conductive film 308 can have a thickness of at least approximately 10 microns or at least approximately 30 microns, and in another embodiment, the conductive film 308 can have a thickness no greater than approximately 2 mm or no greater than approximately 100 mm.

In a particular embodiment, the conductive film 308 can be formed such that a separation-enhancing species 307 is incorporated within the conductive film 308 when it is formed, as illustrated in FIG. 3. As will be described later, the separation-enhancing species 307 can help separate a portion of the substrate, in the form of a semiconductor layer, from a remaining portion of the substrate 102. In a particular embodiment, the separation-enhancing species 307 is hydrogen. When the conductive film 308 is formed using an electrochemical process, such as plating (i.e., electroplating or electroless plating), hydrogen may be incorporated from the conductive film 308 from the plating bath, such as an acidic solution. When a PVD, CVD, or ALD process is used, hydrogen may come from a hydrogen-containing gas, such as an organometallic precursor, water vapor, a hydrogen-containing plasma, or any combination thereof.

FIG. 4 illustrates the workpiece 100 after the separation-enhancing species 307 is diffused, transported, or otherwise moved from the metallic layer 309 into the substrate 102 of the workpiece 100 to a location 409. The movement of the separation-enhancing species 307 can aid in separating a combination of the metallic layer 309, the doped region 204, and a semiconductor layer, which is a portion of the substrate 102 from a remaining portion of the substrate 102. The separation-enhancing species 307 can be moved by an annealing process. The annealing process can be controlled based on the uniformity and defect levels desired in the workpiece 100. The annealing temperature may be determined at least in part on the composition of the substrate 102 and layers of the workpiece 100. In an embodiment, the anneal is performed at a temperatures of at least approximately 25° C. or at least approximately 100° C., and in another embodiment, the anneal is performed at a temperature no greater than approximately 700° C. or no greater than approximately 500° C. In an embodiment, the anneal is performed for a time of at least approximately 1 second or at least approximately 1 hour, and in another embodiment, the anneal is performed at a temperature no greater than approximately 20 hours or no greater than approximately 6 hours.

The temperature and time of the anneal can depend on the particular application for the semiconductor device being formed. The thickness of the semiconductor layer may be based at least on part on the composition of substrate 102 and the particular electronic application, such as a photovoltaic cell, a light emitting device, a radiation detector, or the like. In an embodiment, the semiconductor layer can have a thickness of at least approximately 1 micron or at least approximately 20 microns, and in another embodiment, the semiconductor layer can have a thickness no greater than approximately 100 microns or no greater than approximately 50 microns. As the semiconductor layer thickness increases, the anneal temperature, the anneal time, or a combination of the anneal temperature and time may increase, and conversely, as the semiconductor layer thickness decreases, the anneal temperature, the anneal time, or a combination of the anneal temperature and time may decrease.

Note that even though the metal-containing film 206 may include a barrier film, such barrier film helps to reduce the likelihood that a metallic material from the conductive film 308 from entering the substrate 102. However, the separation-enhancing species 307 may diffuse or otherwise migrate through the barrier film. Thus, a barrier film is effectively a barrier to the metallic material within the conductive film 308 and not a barrier to the separation-enhancing species 307.

During heating or cooling after the anneal, stress can build within the substrate 102 and help to separate the combination of the metallic layer 309, the doped region 204, and a semiconductor layer 510, which is a portion of the substrate 102, from a remaining portion of the substrate 102, as illustrated in FIG. 5. Thus, the location 409 in FIG. 4 represents a weak point from which separation may occur. The separation may occur during the heating or cooling or thereafter. For example, a mechanical operation may be used to help with the separation. In a particular embodiment, the separation may occur by cleaving or fracturing the substrate 102 at a location at or near where the separation is to be performed. A wedge, wire, or saw may be used to aid in the mechanical separation. In another embodiment, a metallic paste can be mechanically applied over the workpiece, and a stiffened or handling substrate can be attached to the metallic paste and used to aid the separation operation. In a particular embodiment, the separation can be analogous to an exfoliation operation. As illustrated in FIG. 5, the semiconductor layer 510 remains bonded to the portion of the workpiece which includes the metallic layer 309. The combination of the semiconductor layer 510, the metallic layer 309, and the doped region 204 are now thick enough to be handled mechanically for further processing.

In another embodiment, the separation-enhancing species 307 can be moved by an electrical field. For example, if the hydrogen is positively charged, then a sufficient strong negative charge from the substrate, a positive charge on the conductive film 308, or both may be used to move the hydrogen from the conductive film 308 into the substrate 102. An anneal and separation process as previously described can be performed.

Figure 6:
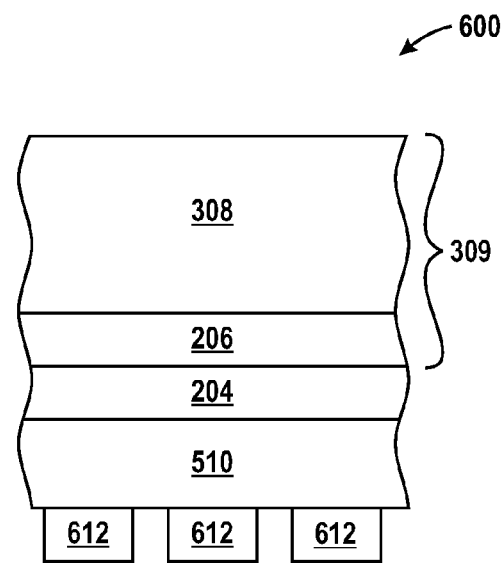
FIG. 6 includes an illustration of a cross-sectional view of a substantially completed semiconductor device.

FIG. 6 illustrates a semiconductor device 600 after a patterned interconnect layer 612 has been formed. The interconnect layer 612 can be formed using a conventional or proprietary technique. In a particular embodiment, the semiconductor device 600 can be used as one or more photovoltaic cells. In another embodiment, the semiconductor device 600 may be further processed and singulated to form light emitting devices. In yet another embodiment, the metal interconnect layers 612 may be formed after further deposition of additional layers (not illustrated) on surface of the semiconductor layer 510. These additional layers may include an oxide, a nitride, an epitaxial layer or a non-epitaxial layer, or any combination thereof.

An electronic device can include the semiconductor device 600 or a plurality of semiconductor devices similar to or different from the semiconductor device 600. The electronic device can be a solar panel that includes one or more of the semiconductor devices, wherein the semiconductor devices are photovoltaic devices. In another embodiment, the electronic device can be a display that includes one or more of the semiconductor devices, wherein the semiconductor devices are light emitting devices. In still another embodiment, the electronic device can be a radiation detector that includes one or more of the semiconductor devices, wherein the semiconductor devices are radiation sensors. The electronic device can include different types of semiconductor devices. For example, an electronic device may include a display that includes control logic to adjust the intensity of the display based on the ambient light level within a room. In this particular electronic device, both light emitting devices and radiation sensors may be used. After reading this specification, skilled artisans will appreciate that many different configurations can be used to achieve a wide variety of applications.

In prior embodiments, a separation-enhancing species can be incorporated within the metallic layer 309 during its formation. In other embodiment, another separation-enhancing species can be used and introduced into the metallic layer 309 or the substrate 102 using ion implantation. Ion implantation may allow for better control over the thickness of the subsequently-formed semiconductor layer, as compared to embodiments previously described.

Figure 7:
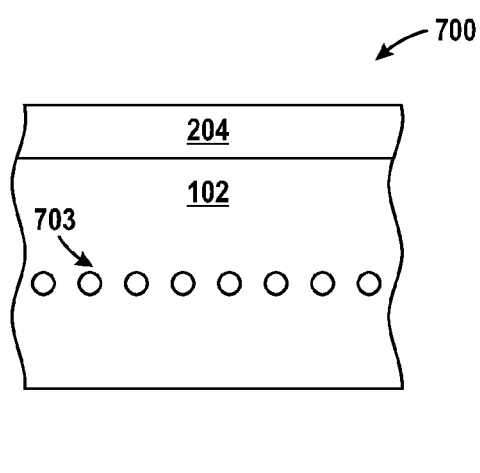
FIG. 7 includes an illustration of a cross-sectional view of a portion of a workpiece after formation of voids to aid in the separation of the semiconductor layer in accordance with an alternative embodiment.

FIG. 7 illustrates the workpiece 700 in another embodiment, in which the separation-enhancing species, such as hydrogen, helium, boron, silicon, fluorine, or chlorine, is implanted into the substrate 102. Although not limited to those species, the relatively lighter species may allow the species to be implanted relatively farther into the substrate 102 than if a relatively heavier species (e.g., germanium or arsenic) were used. Thus, the damage to the substrate 102 may be less. After a particular species is selected, an implant energy is determined to achieve a desired projected range. The projected range can lie closer to the side of the substrate 102 adjacent to the doped region 204 as compared to the opposite side of the substrate 102. In a particular embodiment, the projected range is substantially equal to the desired thickness of the semiconductor layer that will be formed upon subsequent separation. The dose of the implant can be at least approximately $10^{15}$ ions/cm$^2$, approximately $10^{16}$ ions/cm$^2$, or even higher.

In another embodiment, the ion implantation can create defect sites that getter other separation-enhancing species from a subsequently-formed metallic layer, thus aiding in the movement of the other separation-enhancing species from the metallic layer into the substrate 102. A combination of separation-enhancing species incorporated by an electrochemical process and the implantation allows a lower dose to be used during ion implantation. For example, the combination may reduce the dose during implant by approximately one to two orders of magnitude.

Figure 8:
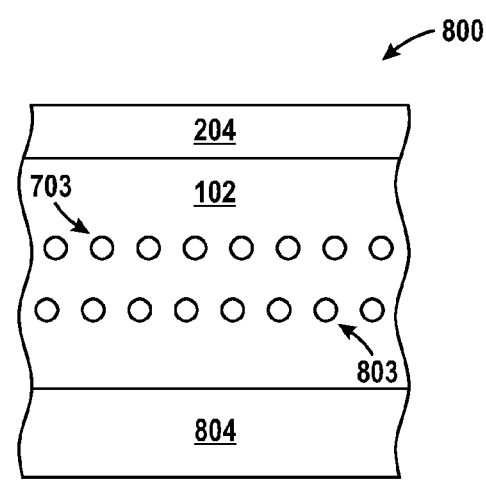
FIG. 8 includes an illustration of a cross-sectional view of a portion of a workpiece after formation of a plurality of voids adjacent to primary surfaces of the workpiece in accordance with another alternative embodiment.
Figure 9:
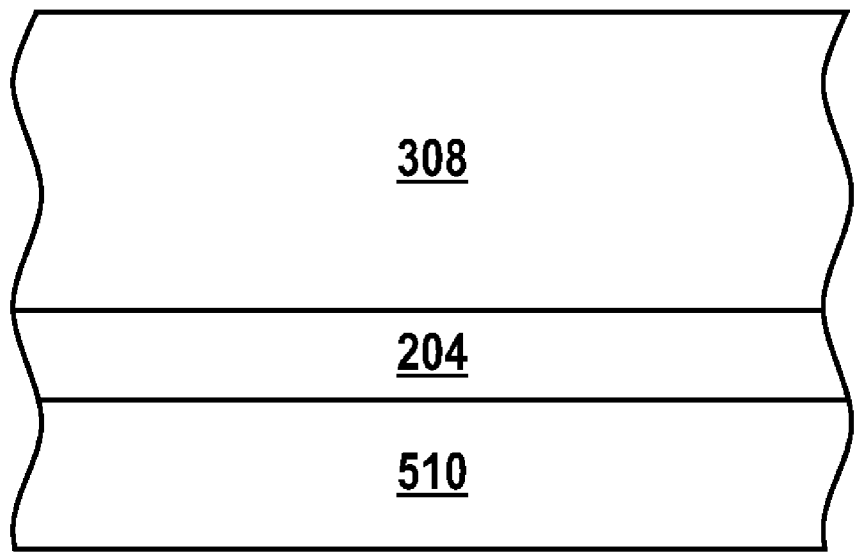
FIG. 9 includes an illustration of a cross-sectional view of the workpiece of FIG. 8 after the semiconductor layers have been separated from opposite sides of a substrate.
Figure 9:
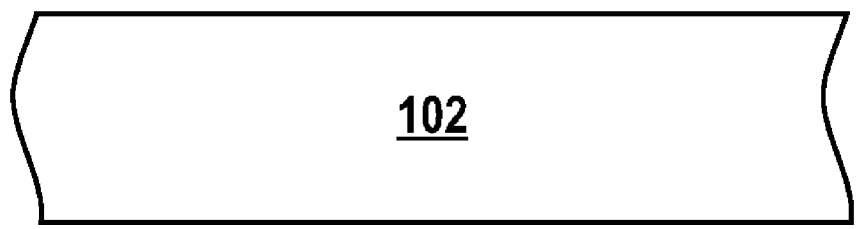
Figure 9:
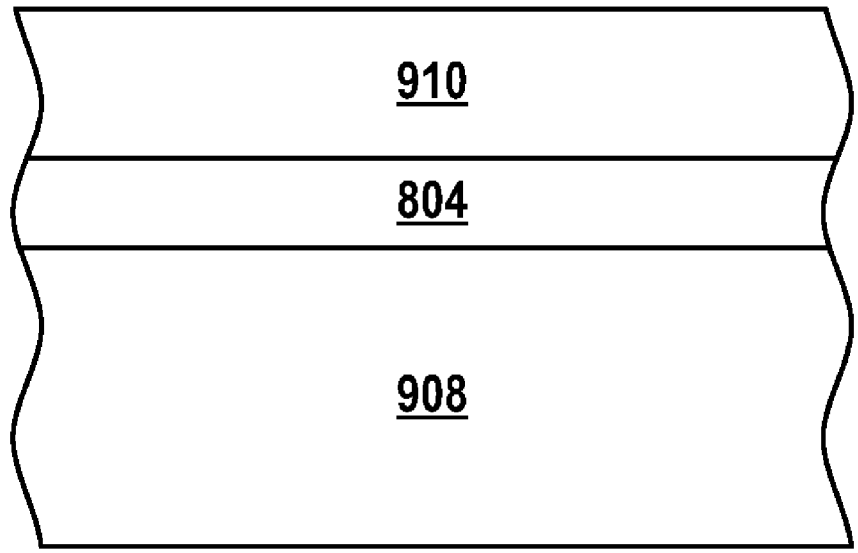

FIGS. 8 and 9 illustrates workpiece 800 in another embodiment, wherein the method of separation of the semiconductor layers occurs along opposite sides of the substrate 102. Any of the previously described processes can be used for the method. The embodiment as illustrated in FIGS. 8 and 9 includes a particular, non-limiting embodiment. After reading this specification, skilled artisans will appreciate that other embodiments may be used without departing from the concepts described herein.

In the embodiment as illustrated in FIG. 8, doped regions 204 and 804 are formed along opposite sides of the substrate 102. The doped regions 204 and 804 can be formed using any of the techniques as previously discussed with respect to the doped region 204 in FIG. 2. The doped regions 204 and 804 may have the same dopant or different dopants, have the same junction depth or different junction depths from their corresponding sides, may be formed the same formation technique or different formation techniques, and may be formed at substantially the same time or at different times. Separation-enhancing species can be formed at locations 703 and 803. The separation-enhancing species at regions 703 and 803 can be formed using any the techniques as previously discussed with respect to the separation-enhancing species at regions 703 in FIG. 7. The separation-enhancing species at regions 703 and 803 may have the same separation-enhancing species or different separation-enhancing species, the regions 703 and 803 may be the same distance or different distances from their corresponding sides, may be formed the same formation technique or different formation techniques, the may be formed at substantially the same time or at different times.

FIG. 9 illustrates workpiece 800 after additional processing. Metallic layers 308 and 908 are formed along opposite exposed sides of the workpiece. The metallic layers 308 and 908 can be formed using any the techniques as previously discussed with respect to the metallic layer 308 in FIGS. 2 and 3. The metallic layers 308 and 908 may have the same films and compositions or different films or different compositions, have the same thickness or different thicknesses, may be formed the same or different formation technique or different formation techniques, and the may be formed at substantially the same time or at different times. In a particular embodiment, a separation-enhancing species can be incorporated into the metallic layers 308 and 908 during the same electrochemical process, for example, plating. The workpiece can be annealed and cooled as previously described and allow semiconductor layers 510 and 910 to be removed from the substrate 102. If needed or desired, any of the previously described mechanical operations can be used to assist in separating the semiconductor layer 510, 910, or both layers from the substrate 102. The semiconductor layers 510 and 910 may have the same or different thickness. Subsequent processing, such as forming patterned interconnect layers adjacent to the semiconductor layers 510 and 910, may be performed to form substantially completed semiconductor devices.

Dual processing embodiments, such as the embodiment previously described and illustrated in FIGS. 8 and 9, may allow one or more processing operations to be performed simultaneously, and thus, increase equipment throughput. The same type of different types of semiconductor devices may be formed along the opposite sides of the substrate 102.

Figure 10:
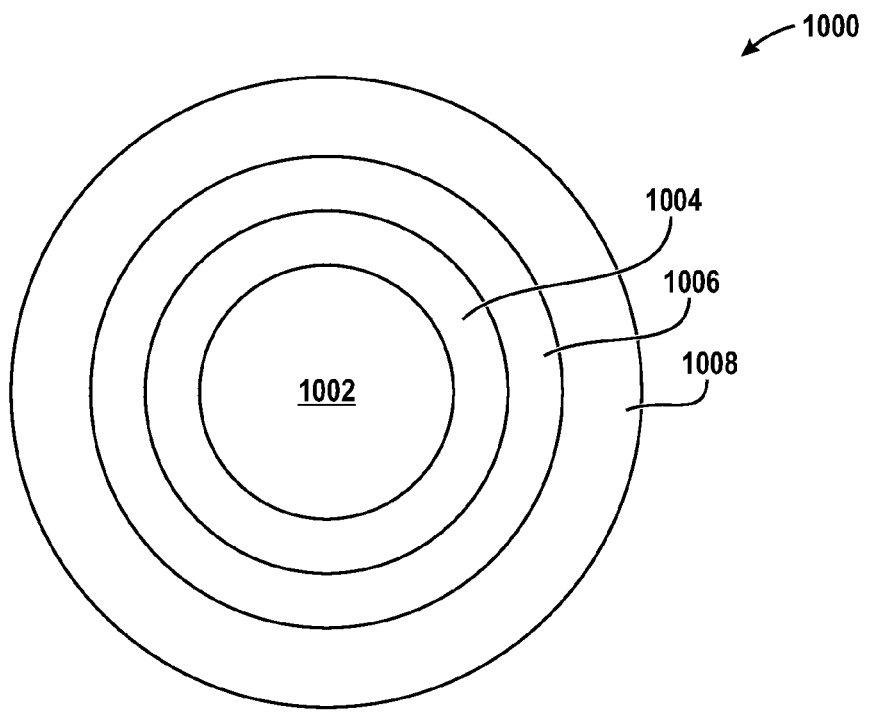
FIG. 10 includes an illustration of a cross-sectional view of a portion of a workpiece comprising a substrate, in ingot form, a doped region, and a conductive layer.

Embodiments previously described may use substrates that are in a wafer form. In another embodiment, the substrate may be in an ingot form. In a particular embodiment as illustrated in FIG. 10, the substrate 1002 can be substantially cylindrical. Such a substrate can be made from a boule grown using a Czochralski growth technique and machined to the desired shape. The ingot can have a diameter of approximately 50 mm to approximately 300 mm or even larger. The length of the ingot can be greater than the diameter and can range from approximately 150 mm to approximately 5 meters. The substrate 1002 can include any of the materials are previously described with respect to the substrate 102. The workpiece 100 further includes a doped region 1004, a metal-containing film 1006, and a conductive film 1008, which can includes any of the materials, have any of the thicknesses, and be formed using any of the techniques as previously described with respect to the doped region 204, the metal-containing film 206, and the conductive film 308, respectively, as previously described. A separation-enhancing species (not illustrated) can be introduced into the workpiece during an ion implantation operation, during formation of the conductive film 308, or both. After reading this specification, skilled artisans will appreciate that one or more of the regions or films of the workpiece 1000 are not required and may not be used, and that other regions or films as previously described but are not illustrated may be used.

Figure 11:
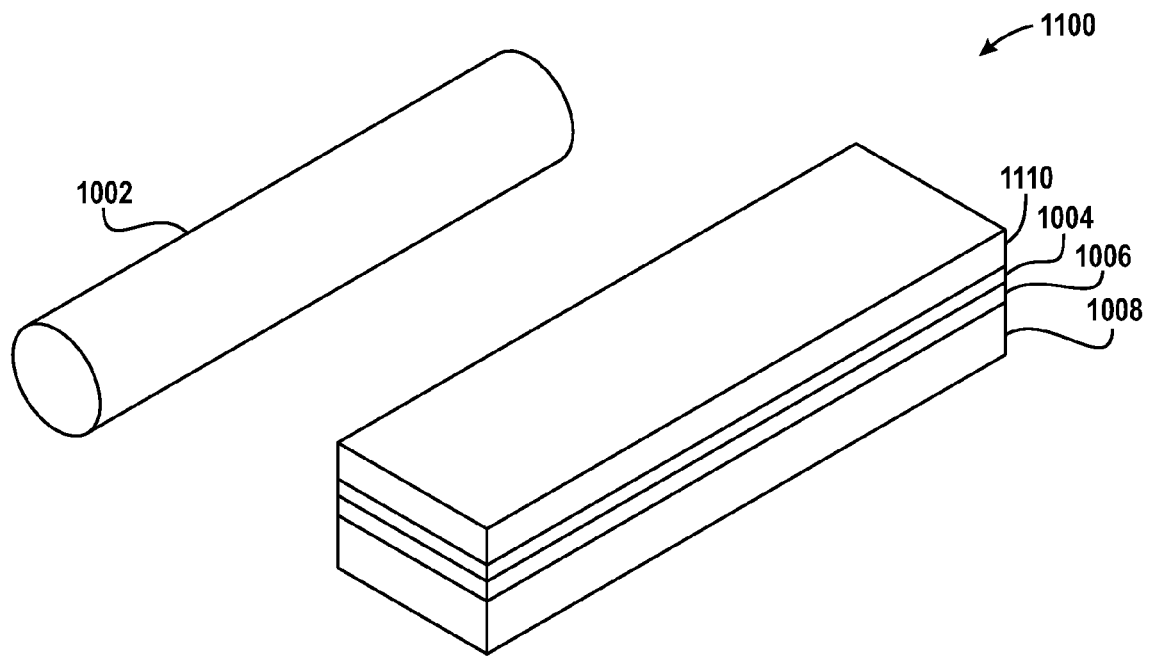
FIG. 11 includes an illustration of a cross-sectional view of the workpiece of FIG. 10 after a combination of a semiconductor layer, the doped region, the conductive layer has been separated from the substrate.

The conductive film 1008 can be scored, perforated, or cut to provide a weakened location from which separation can more readily start. The workpiece 1000 is then annealed using annealing conditions as previously described. During heating or cooling after the anneal, stress can build within the substrate 1002 and help to separate the combination of the conductive film 1008, the metal-containing film 1006, the doped region 1004, and a semiconductor layer 1110, which is a separated portion of the substrate 1002, from a remaining portion of the substrate 1002, as illustrated in FIG. 11. The resultant workpiece 1100 can be further processed to form a semiconductor device. In this particular embodiment, the semiconductor device can be in the form of a rectangular sheet, as opposed to a circular disk. In still another embodiment, the substrates may be substantially rectangular and be formed using an edge-defined growth technique.

The embodiments described herein allow a separation-enhancing species to be introduced into a substrate to allow more readily the separation of a surface layer of semiconductor material to be removed from the substrate. A mechanical operation may not need to be performed for the separation, or if a mechanical operation is used, such mechanical operation would not need to be as aggressive or damaging as compared to a mechanical tearing operation performed in the absence of the separation-enhancing species. Further, use of the separation-enhancing techniques can improve reproducibility of the thickness of the semiconductor layer from semiconductor device to semiconductor device. Ion implantation can be performed such that the projected range in controlled with a few microns from semiconductor device to semiconductor device. Even if the separation-enhancing species is not implanted, for example, movement of separation-enhancing species from a metallic layer into the substrate, thickness control is better than a mechanical tearing operation in the absence of the separation-enhancing species. Still further, the resulting surfaces of the semiconductor layers (along the separated zones) may be smoother when a separation-enhancing technique is performed, as compared to a mechanical tearing operation without the use of a separation-enhancing technique.

Thus, after reading this specification, skilled artisans will appreciate methods described herein can be used to form a semiconductor device with a metallic layer as a support on without the need for a separate substrate or handle to be used, such as during a mechanical tearing operation. In still further embodiments, when one of the separation-enhancing species includes hydrogen that moves from the metallic layer into the substrate, the separation operation can be further enhanced by implanting another separation-enhancing species, such as silicon, or by forming a brittle layer, such as porous semiconductor layer. In a particular embodiment, porous silicon may be achieved by implanting fluorine or chlorine into the substrate.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method can include forming a metallic layer by an electrochemical process over a first side of a semiconductor substrate, wherein the semiconductor substrate has at least one doped junction. The method can also include incorporating hydrogen into the metallic layer overlying the semiconductor substrate, and moving the hydrogen from the metallic layer into the semiconductor substrate by an anneal process. The method can further include separating a semiconductor layer and the metallic layer from the semiconductor substrate.

In an embodiment of the first aspect, the semiconductor substrate includes a hydrogen-implanted region, and wherein the moving the hydrogen from the metallic layer into the semiconductor substrate is used to separate the semiconductor layer from the semiconductor substrate. In a particular embodiment, the semiconductor substrate includes a plurality of hydrogen-implanted regions. In another embodiment, the method further includes forming a metallic layer by the electrochemical process over a second side of the semiconductor substrate. In still another embodiment, the metallic layer is formed by physical vapor deposition, atomic layer deposition, chemical vapor deposition, or any combination thereof. In a further embodiment, the metallic layer includes titanium, tungsten, palladium, copper, tin, nickel, or any combination thereof. In yet a further embodiment, the forming the metallic layer further includes mechanically applying a metallic paste over the semiconductor substrate.

In another embodiment of the first aspect, the semiconductor substrate includes silicon, germanium, gallium arsenide, gallium nitride, indium phosphide, or any combination thereof. In still another embodiment, the semiconductor substrate is gallium arsenide. In a further embodiment, the method further includes adding contacts to the separated semiconductor layer to form a photovoltaic cell. In still a further embodiment, the method further includes adding contacts to the separated semiconductor layer to form a light emitting device.

In a second aspect, a method can include implanting a species into a semiconductor substrate corresponding to a projected range, wherein the semiconductor substrate has at least one doped junction, and wherein the species includes hydrogen, helium, or boron. The method can also include forming a metallic layer by an electrochemical process over a first side of a semiconductor substrate. The method can still further include separating a semiconductor layer and the metallic layer from the semiconductor substrate after implanting the species.

In an embodiment of the second aspect, implanting the species forms a plurality of hydrogen-implanted regions. In another embodiment, the metallic layer is formed by physical vapor deposition, atomic layer deposition, chemical vapor deposition, or any combination thereof. In still another embodiment, the metallic layer includes titanium, tungsten, palladium, copper, tin, nickel, or any combination thereof. In a further embodiment, forming the metallic layer further includes mechanically applying a metallic paste over the semiconductor.

In another embodiment of the second aspect, the semiconductor substrate includes silicon, germanium, gallium arsenide, gallium nitride, indium phosphide, or any combination thereof. In still another embodiment, the method further includes forming a metallic layer by the electrochemical process over a second side of the semiconductor substrate. In a further embodiment, the method further includes adding contacts to the separated semiconductor layer to form a photovoltaic cell. In still a further embodiment, the method further includes adding contacts to the separated semiconductor layer to form a light emitting device.

In a third aspect, a method of forming an electronic device can include forming a first metallic layer by a first electrochemical process over a first side of a substrate that includes a semiconductor material. The method can further include introducing a first separation-enhancing species into the substrate at a first distance from the first side. The method can still further include separating a first semiconductor layer and the first metallic layer from the substrate, wherein the first semiconductor layer is a first portion of the substrate.

In an embodiment of the third aspect, the substrate is a substantially monocrystalline semiconductor substrate. In another embodiment, the substrate principally includes silicon, germanium, gallium arsenide, gallium nitride, indium phosphide, or any combination thereof. In still another embodiment, the method further includes doping a portion of the substrate with a dopant having a conductivity type opposite that of the substrate. In a further embodiment, the method further includes depositing a doped semiconductor layer over substrate before forming the first metallic layer, wherein the doped semiconductor layer has a conductivity type opposite that of the substrate.

In another embodiment of the third aspect, the first metallic layer includes titanium, tungsten, palladium, copper, tin, nickel, or any combination thereof. In still another embodiment, forming the first metallic layer further includes forming an adhesion film, a barrier film, or both before initiating the first electrochemical process. In a further embodiment, wherein forming the first metallic layer further includes forming a seed film over the substrate before initiating the first electrochemical process. In still a further embodiment, forming the first metallic layer is performed using physical vapor deposition, atomic layer deposition, chemical vapor deposition, or any combination thereof. In yet a further embodiment, forming the first metallic layer is performed using a hydrogen-containing gas. In another embodiment, the first electrochemical process includes plating.

In a further embodiment of the third aspect, incorporating the first separation-enhancing species includes incorporating hydrogen into the first metallic layer; and moving the hydrogen from the first metallic layer into the substrate. In a particular embodiment, forming the first metallic layer is performed using an acidic solution as a source of hydrogen. In another particular embodiment, forming the first metallic layer and incorporating hydrogen into the first metallic layer occur substantially simultaneously during a particular time period. In still another embodiment, forming the metallic layer further includes mechanically applying a metallic paste over the semiconductor.

In another embodiment of the third aspect, introducing hydrogen includes implanting a separation-enhancing species at an energy corresponding to a projected range that is closer the first distance than to the first side. In a particular embodiment, the projected range is substantially equal to the first distance. In still another embodiment, the separation-enhancing species includes hydrogen, helium, boron, silicon, fluorine, or chlorine.

In a further embodiment of the third aspect, the method further includes annealing the substrate and the first metallic layer. In still a further embodiment, separating the first semiconductor layer and the first metallic layer from the substrate includes mechanically separating the first semiconductor layer and the first metallic layer from the substrate. In a particular embodiment, wherein mechanically separating the first semiconductor layer and the first metallic layer from the substrate is performed using a wedge, a wire, or a saw. In yet a further embodiment, separating the first semiconductor layer and the first metallic layer from the substrate includes fracturing or cleaving the substrate at substantially the first distance from the first side of the substrate. In another embodiment, after separating the first semiconductor layer and the first metallic layer from the substrate, the first metallic layer is thicker than the first semiconductor layer. In still another embodiment, separating the first semiconductor layer and the first metallic layer from the substrate, the first metallic layer is at least approximately 11 times thicker than the first semiconductor layer.

In another embodiment of the third aspect, forming the first metallic layer to a thickness, such that by itself, the first metallic layer provides sufficient mechanical support to the first semiconductor layer. In still another embodiment, the method further includes adding contacts to the first semiconductor layer after separating the first semiconductor layer and the first metallic layer from the substrate. In yet another embodiment, the first semiconductor layer has a thickness in a range of approximately 1 micron to approximately 100 microns. In a further embodiment, the electronic device includes a photovoltaic cell, a light emitting device, or a radiation detector, each of which includes the first semiconductor layer and the first metallic layer.

In a further embodiment of the third aspect, the method further includes forming a second metallic layer by a second electrochemical process over a second side of the substrate, wherein the second side is opposite the first side, introducing a second separation-enhancing species into the substrate at a second distance from the second side, and separating a second semiconductor layer and the second metallic layer from the substrate, wherein the second semiconductor layer is a second portion of the substrate. In a particular embodiment, forming the first metallic layer and forming a second metallic layer are performed substantially simultaneously during a first time period; and introducing the first separation-enhancing species and introducing the second separation-enhancing species are performed substantially simultaneously during a second time period. In another particular embodiment, a combination of the first semiconductor layer and first metallic layer is of a first semiconductor device type, a combination of the second semiconductor layer and second metallic layer is of the first semiconductor device type, and a thickness of the first semiconductor layer is substantially the same as a thickness of the second semiconductor layer. In still another particular embodiment, a combination of the first semiconductor layer and first metallic layer is of a first semiconductor device type, a combination of the second semiconductor layer and second metallic layer is of a second semiconductor device type, and a thickness of the first semiconductor layer is different from a thickness of the second semiconductor layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method comprising:
   plating a first metallic layer over a first side of a semiconductor substrate, wherein the semiconductor substrate has at least one doped junction;
   incorporating hydrogen into the first metallic layer overlying the semiconductor substrate, wherein incorporating the hydrogen occurs during plating the first metallic layer;
   moving the hydrogen from the first metallic layer into the semiconductor substrate by an anneal process; and
   separating a semiconductor layer and the first metallic layer from the semiconductor substrate.

2. A method comprising:
   forming a metallic layer by an electrochemical process over a first side of a semiconductor substrate, wherein the semiconductor substrate has at least one doped junction;
   incorporating hydrogen into the metallic layer overlying the semiconductor substrate;
   moving the hydrogen from the metallic layer into the semiconductor substrate by an anneal process; and
   separating a semiconductor layer and the metallic layer from the semiconductor substrate, wherein the semiconductor substrate comprises a hydrogen-implanted region, and wherein the moving the hydrogen from the metallic layer into the semiconductor substrate is used to separate the semiconductor layer from the semiconductor substrate.

3. The method of claim 2, wherein the semiconductor substrate comprises a plurality of hydrogen-implanted regions.

4. The method of claim 1, further comprising plating the first metallic layer over a second side of the semiconductor substrate.

5. The method of claim 1, further comprising forming a second metallic layer over the semiconductor substrate before plating the first metallic layer, wherein the second metallic layer is formed by physical vapor deposition, atomic layer deposition, chemical vapor deposition, or any combination thereof.

6. The method of claim 5, wherein the second metallic layer comprises titanium, tungsten, palladium, copper, tin, nickel, silver, gold, or any combination thereof.

7. The method of claim 1, further comprising forming a second metallic layer by mechanically applying a metallic paste over the semiconductor substrate.

8. The method of claim 1, wherein separating the semiconductor layer and the first metallic layer from the semiconductor substrate is caused at least in part by moving the hydrogen from the first metallic layer into the semiconductor substrate.

9. The method of claim 1, wherein separating the semiconductor layer and the first metallic layer from the semiconductor substrate comprises using a wire to aid in the separation.

10. The method of claim 1, further comprising adding contacts to the separated semiconductor layer to form a photovoltaic cell.

11. The method of claim 1, further comprising adding contacts to the separated semiconductor layer to form a light emitting device.

12. A method comprising:
    plating a first metallic layer over a first side of a semiconductor substrate wherein a separation-enhancing species is incorporated within the first metallic layer during plating;
    annealing the first metallic layer and the semiconductor substrate to move at least some of the separation-enhancing species from the first metallic layer into the semiconductor substrate, wherein during heating or cooling after the anneal, stress builds within semiconductor substrate; and
    separating a semiconductor layer and the first metallic layer from the semiconductor substrate, wherein the stress within the semiconductor substrate helps in separating the semiconductor layer and the first metallic layer from the semiconductor substrate.

13. The method of claim 12, wherein the separation-enhancing species includes hydrogen.

14. The method of claim 12, further comprising forming a second metallic layer over the semiconductor substrate before plating the first metallic layer, wherein the second metallic layer is formed by physical vapor deposition, atomic layer deposition, chemical vapor deposition, or any combination thereof.

15. The method of claim 14, wherein the second metallic layer comprises titanium, tungsten, palladium, copper, tin, nickel, silver, gold, or any combination thereof.

16. The method of claim 12, wherein separating the semiconductor layer comprises using a wire.

17. The method of claim 12, wherein the semiconductor substrate comprises silicon, germanium, gallium arsenide, gallium nitride, indium phosphide, or any combination thereof.

18. The method of claim 12, further comprising plating the first metallic layer over a second side of the semiconductor substrate.

19. The method of claim 12, further comprising adding contacts to the separated semiconductor layer to form a photovoltaic cell.

20. The method of claim 12, further comprising adding contacts to the separated semiconductor layer to form a light emitting device.

* * * * *